US006741077B2

United States Patent
Yokoyama et al.

(10) Patent No.: US 6,741,077 B2
(45) Date of Patent: May 25, 2004

(54) ELECTRON SPIN RESONANCE MEASUREMENT METHOD AND MEASUREMENT DEVICE FOR MEASURING ESR WITHIN THE INTERIOR OF LARGE SAMPLES

(75) Inventors: Hidekatsu Yokoyama, Koriyama (JP); Tateaki Ogata, Yonezawa (JP); Tadaaki Tsuchiya, Yonezawa (JP); Ryosuke Kudo, Yonezawa (JP)

(73) Assignee: Yamagata Public Corporation for the Development of Industry, Yamagata (JP)

( * ) Notice: Subject to any disclaimer, the term of this patent is extended or adjusted under 35 U.S.C. 154(b) by 0 days.

(21) Appl. No.: 10/131,026

(22) Filed: Apr. 25, 2002

(65) Prior Publication Data

US 2002/0163336 A1 Nov. 7, 2002

Related U.S. Application Data

(63) Continuation of application No. PCT/JP01/07208, filed on Aug. 23, 2001.

(30) Foreign Application Priority Data

Aug. 25, 2000 (JP) ........................................ 2000-254888

(51) Int. Cl.[7] ................................................ G01V 3/00
(52) U.S. Cl. ...................................... 324/316; 324/318
(58) Field of Search ................................. 324/309, 313, 324/316, 318, 322, 600; 600/410, 420, 423

(56) References Cited

U.S. PATENT DOCUMENTS

| | | | | |
|---|---|---|---|---|
| 4,296,378 A | * | 10/1981 | King ........................... | 324/313 |
| 5,390,673 A | * | 2/1995 | Kikinis ........................ | 600/410 |
| 5,596,276 A | * | 1/1997 | Nakagawa et al. .......... | 324/316 |
| 5,619,139 A | * | 4/1997 | Holczer et al. ............. | 324/318 |
| 6,311,086 B1 | * | 10/2001 | Ardenkjaer-Larsen et al. ........................... | 600/420 |
| 2002/0163336 A1 | * | 11/2002 | Yokoyama et al. ......... | 324/316 |

FOREIGN PATENT DOCUMENTS

JP     2000-237165     5/2000

\* cited by examiner

*Primary Examiner*—Diego Gutierrez
*Assistant Examiner*—Tiffany A. Fetzner
(74) *Attorney, Agent, or Firm*—Birch, Stewart, Kolasch & Birch, LLP

(57) ABSTRACT

Disclosed are a method of measuring ESR in a sample located outside a resonator using the $B_1$ leaking to the exterior from the end of the resonator; and an ESR device comprised of at least a resonator capable of applying a $B_1$ leaking from the end of the resonator to a sample located outside the resonator, and a magnet located on the resonator side of a plane containing the end of the resonator that is capable of applying a $B_0$ and a modulation field. These inventions enable ESR measurement of the interior of large samples.

20 Claims, 4 Drawing Sheets

— 1 —
ELECTRON SPIN RESONANCE MEASUREMENT METHOD AND MEASUREMENT DEVICE FOR MEASURING ESR WITHIN THE INTERIOR OF LARGE SAMPLES

This application is a Continuation of copending PCT International Application No. PCT/JP01/07208 filed on Aug. 23, 2001, which was not published in English and which designated the United States and on which priority is claimed under 35 U.S.C. §120, the entire contents of which are hereby incorporated by reference.

TECHNICAL FIELD

The present invention relates to an electron spin resonance (ESR) measurement method and a measurement device for detecting free radials in large samples. More particularly, the present invention relates to a method of measuring ESR in samples outside a resonator using the alternating magnetic field ($B_1$) leaking to the exterior from the end of the resonator, and to an ESR device in which a resonator, a main electromagnet, and a field modulation coil are integrated to implement this method.

RELATED ARTS

Free radicals are known to induce or aggravate a variety of diseases such as cancer, acute inflammation, ulcers, and myocardial infarction. Accordingly, it is anticipated that it will be possible to apply the in vivo detection of free radicals to the establishment of methods of diagnosing, treating, and preventing diseases relating to free radicals.

Previous ESR methods are known to be good methods of nondestructively detecting with high sensitivity the unpaired electrons of free radicals within substances. Further, it is possible to read a variety of information about a substance from changes in, and the range of, fluctuation of the Larmor precession frequency in the field of unpaired electrons. Measuring ESR in vivo requires the measurement at ordinary temperature of a high-volume, high dielectric loss sample in the form of an organism. However, in previous ESR, the sample insertion space of the resonator, which is the detection element, is small and the resonant frequency (about 9.5 GHz) is the high dielectric loss band of water, precluding in vivo measurement.

Accordingly, the methods of lowering the frequency to decrease the dielectric loss and increasing the size of the resonator to widen the sample insertion space have been adopted. However, the resonators that have been fabricated thus far have been limited to a size permitting the insertion of small experimental animals; no device permitting practical use has been developed.

Methods of observing the free radicals on the surface of a large sample such as an organism by using a resonator as a probe head are also being examined. The use of parallel components of $B_1$ as a plane constituting part of the loop of the resonator, permitting the positioning of the main magnet and the field modulation coil on a plane parallel with the loop plane, and the use of an entire device of this type as a probe head to achieve size reduction and integration have been conceived (Patent Application Publication No. Hei 11-046076). In this method, ESR measurement of the surface of a large sample is possible, but deep measurement, that is, ESR measurement of the interior of the sample, is impossible.

In consideration of such problems of prior art, the present invention has for its object to provide an ESR measurement method and device capable of ESR measurement of the interior of large samples.

DISCLOSURE OF THE INVENTION

The present inventors conducted extensive research into achieving the above-stated objects, resulting in the discovery that it was possible to conduct ESR measurement of the interior of a sample positioned outside the resonator by employing the $B_1$ leaking to the exterior from the end of the resonator, and that by employing a device integrating a resonator capable of supplying $B_1$ to a sample located outside the resonator, and an electromagnet capable of supplying a static magnetic field ($B_0$) and a modulation field via a modulation field coil, from the resonator side rather than from a plane contained within the end of the resonator, ESR measurement of the interior of a large sample was possible. The present invention was devised on the basis of this knowledge.

That is, the present invention provides a method of measuring ESR in a sample located outside a resonator using $B_1$ leaking to the exterior from the end of the resonator. In a preferred mode of implementing the present invention, $B_1$ are applied by the end of the resonator to a sample located outside the resonator, and using a magnet located on the resonator side of a plane containing the end of the resonator to apply $B_0$ and a modulation field to the sample, the ESR of the sample is measured. Low-frequency microwaves to radiowaves are employed with preference as the ESR irradiation in the present invention.

The present invention further provides an ESR device comprised of at least a resonator capable of applying $B_1$ leaking from the end of the resonator to a sample located outside the resonator, and a magnet located on the resonator side of a plane containing the end of the resonator that is capable of applying $B_0$ and a modulation field. In the ESR device of the present invention, the resonator, main electromagnet, and field modulation coil are positioned on the resonator side of the plane containing the end of the resonator.

DETAILED DESCRIPTION OF THE PREFERRED EMBODIMENT

Figure 1:
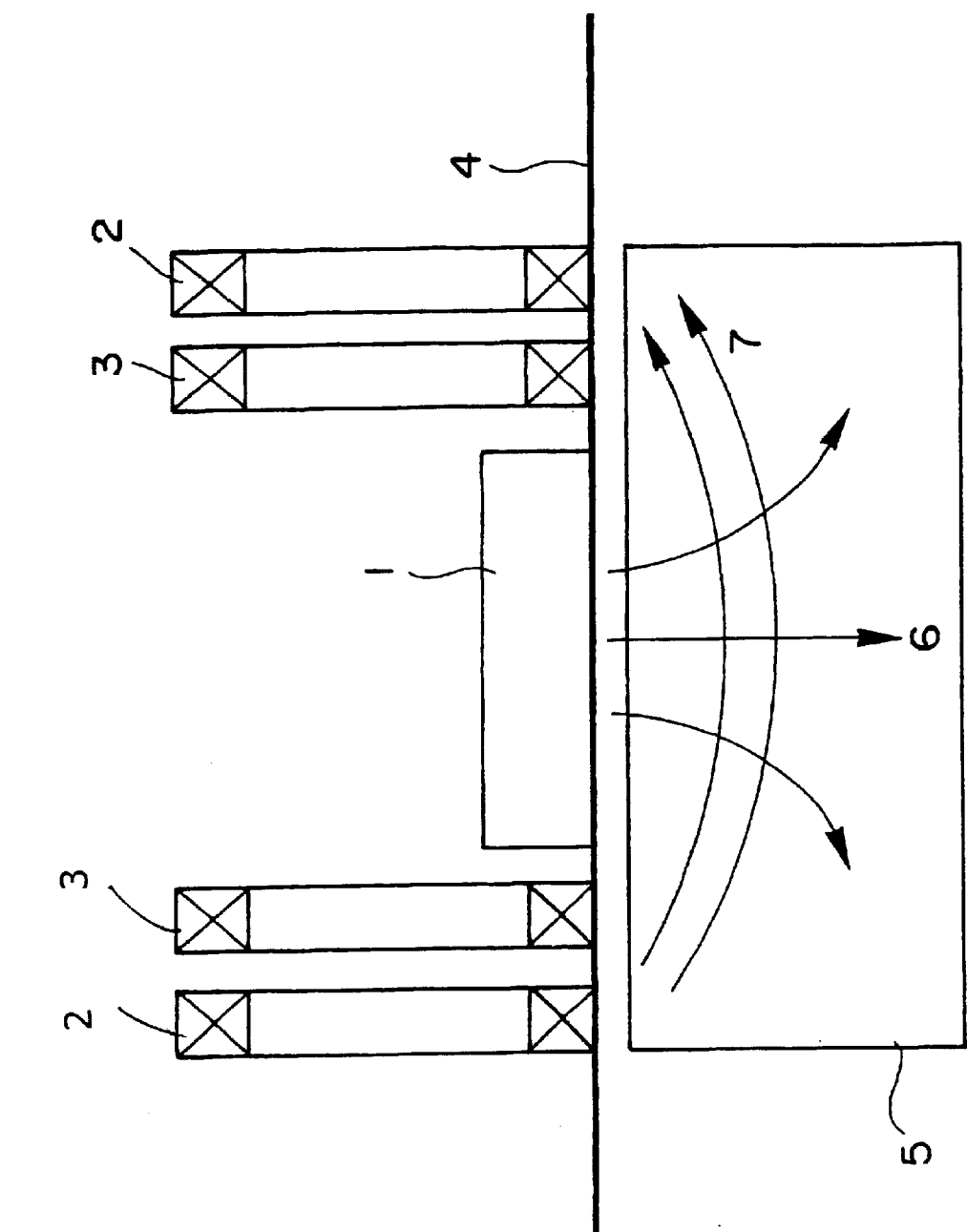
FIG. 1 is a drawing showing the configuration of the ESR device of the present invention.

The method and device of the present invention will be described in detail below with reference to FIG. 1. However, the scope of the present invention is not limited to the examples described.

The present invention is characterized in that ESR measurement of the interior of a sample positioned outside the resonator is conducted using $B_1$ leaking to the outside from the end of the resonator. Supplemental FIG. 1 shows an example of a device suited to the application of the present invention. In this device, a resonator 1, main magnet 2, and field modulation coil 3 are integrated and are all positioned on a plane 4 containing the end of the resonator. A sample 5 is placed below this plane and ESR measurement is conducted outside of resonator 1 using the $B_1$ 6 leaking to the exterior from resonator 1 and the $B_0$ 7, generated perpendicular thereto by the electromagnet.

Any shape known to persons skilled in the art may be suitably selected for the material of resonator 1 employed in the present invention. A nonmagnetic conductor such as silver, copper, or aluminum, or a nonmagnetic dielectric material such as a ceramic or Teflon may be employed as the material. Examples of shapes are surface coil resonators and loop gap resonators; a resonator configured as a simple LC circuit may be employed. However, to achieve a leak $B_1$ of adequate intensity and good uniformity, the resonator inductor is desirably cylindrical in shape, with a comparatively uniform internal $B_1$. A resonator inductor portion loop diameter is desirably employed that is adequately smaller than the wavelength used. The frequency of irradiated electromagnetic waves, that is, the resonant frequency of the resonator, is not specifically limited. However, a low-frequency microwave to radiowave of less than 1 GHz is desirable.

Main magnet 2 is desirably positioned so as not to impede sample 5 placed outside resonator 1. Specifically, it must be positioned to the resonator side of the plane containing the end of the resonator. Any shape known to those skilled in the art may be suitably selected for main magnet 2. Examples are permanent magnets, iron-core coil electromagnets, and air-core coil electromagnets. However, it is desirable to employ an iron core and incorporate a magnetic circuit to achieve an adequately strong $B_0$ of good uniformity. The $B_0$ intensity can be suitably selected based on the resonant frequency employed, but at a resonant frequency of 1 GHz or below, 40 mT or less is desirable.

Field modulation coil 3 is also desirably positioned so as not to impede sample 5 placed outside resonator 1. Specifically, it must be positioned to the resonator side of the plane containing the end of the resonator. Any shape known to those skilled in the art may be suitably selected for modulation field coil 3. Examples are solenoid field coils and spiral field coils. The modulation field intensity can be suitably selected based on the line width of the ESR spectrum of the free radicals being measured. The modulation frequency can also be suitably selected, but something near 100 kHz is desirable for 1/f noise elimination.

When conducting ESR measurement of a sample with such an ESR measurement device, it suffices either for sample 5 to be placed in contact with the side of plane 4 containing the end of the resonator that is opposite resonator 1, or for sample 5 to be positioned in the space near the side of plane 4 comprising the end of the resonator that is opposite resonator 1. Since the sample is positioned outside of resonator 1, permitting measurement without relation to the size of the sample, the present invention is extremely useful in the measurement of large samples such as organisms. After the sample has been positioned, $B_1$ leaking to the exterior from resonator 1 is applied to sample 5, a modulation field and $B_0$ 7 that are perpendicular thereto are applied, and ESR measurement is conducted.

In the present invention, the sample being measured is not specifically limited. For example, a solid sample, an aqueous solution, a nonaqueous solution, an organ tissue liquid isolated or collected from an organism, or the organism itself may be employed. In particular, the present invention can measure an organism as is without inflicting damage. In addition to the bodies of experimental animals such as mice, rats, guinea pigs, rabbits, cats, dogs, monkeys, chimpanzees, and gorillas, the human body can also be measured.

When conducting measurement based on the present invention, it is possible to employ a radical reagent such as a spin label agent or spin trap agent. Any radical reagent that can be employed in ESR measurement can be employed. For example, spin label agents such as 4-hydroxy-2,2,6,6-tetramethyl-piperidine-1-oxyl (TEMPOL) are desirably employed. Radical reagent feeders capable of delivering these radical reagents to measurement sites may also be employed to measure specific sites within an organism.

Embodiment

The present invention is described in greater detail below through an embodiment. The device configuration, material, quantity employed, ratio, operational contents, operating procedures, and the like described in the embodiment below can be suitably modified without departing from the essence of the present invention. Accordingly, the scope of the present invention is not limited to the specific examples given below.

Figure 2:
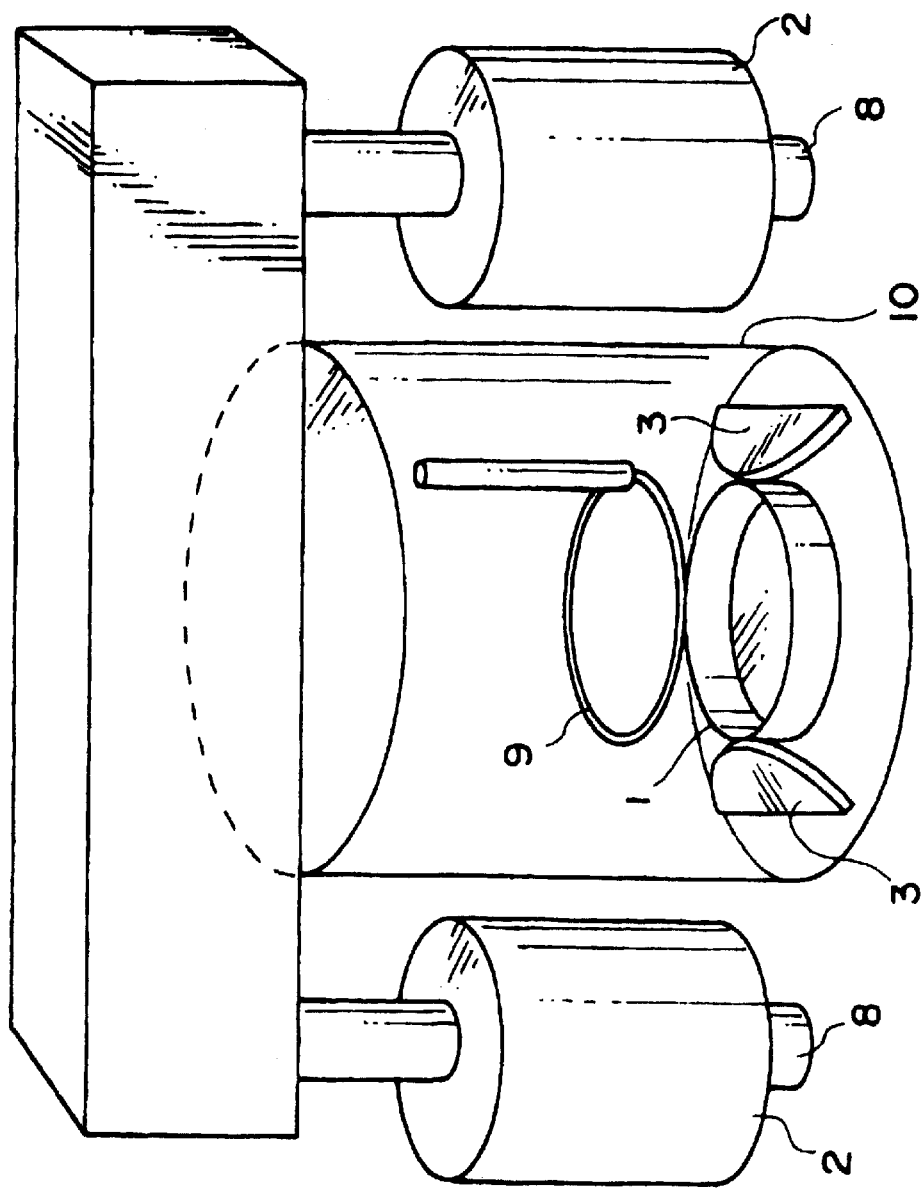
FIG. 2 is a figure showing the general appearance of an ESR device prepared in an embodiment of the present invention.

FIG. 2 shows the general appearance of the ESR device fabricated in the present embodiment. Resonator 1 is an LC circuit comprised of a cylindrical inductor and a ceramic capacitor. In this embodiment, the cylindrical inductor is 40 mm in diameter, 10 mm in axial length, and 0.3 mm in thickness; and the material employed is copper. To prepare resonator 1 a 5 pF ceramic capacitor was soldered to the inductor. Radiowaves were supplied to resonator 1 by using a coupling coil 9 having a loop diameter of 40 mm comprised of copper wire 1 mm in diameter. The resonant frequency was 280 MHz and the unloaded Q value was 550.

The field modulation coil 3 is in the form of a solenoid produced by winding 20 turns of copper wire 0.5 mm in diameter onto a semicircular bobbin with an inner diameter of 45 mm and an axial length of 2 mm. Two of these field modulation coils 3 were positioned on either side of resonator 1 on an incline to the inside of 45 degrees. These coils were capable of generating a maximum modulation field of 0.2 mT at a modulation frequency of 100 kHz at a position 10 mm from the bottom end of resonator 1. Resonator 1 and modulation coils 3 were positioned within a cylindrical shield case 10 with an inner diameter of 100 mm and an axial length of 100 mm. The bottom end of resonator 1, the bottom ends of magnetic modulation coils 3, and the bottom surface of shielded case 10 were positioned on the same plane.

An iron-core magnet was employed as main magnet 2. Two solenoid electromagnets, made by winding 756 turns of copper wire 1 mm in diameter on a cylindrical bobbin with an inner diameter of 55 mm and an axial length of 60 mm, were connected in a -type magnetic circuit to prepare the main magnetic. Magnetic circuit 8 was 135 mm in height and 250 mm in width; the rolled steel commonly used in structures was employed as the material. The electromagnet of the main magnet was employed both to generate $B_0$ and for scanning. The $B_0$ intensity was a maximum of 10 mT at 10 mm below the bottom end of resonator 1 and the scan width was 6.5 mT. The bottom end of magnetic circuit 8 was on the same plane as the bottom end of resonator 1.

Since the bottom ends of resonator 1, main magnet 2, and field modulation coil 3 were all positioned on the same plane and integrated in this measurement device, a large sample could be placed below the plane and measured. Power supply lines of the main magnet and the field modulation coil, the radiowave source, and detection circuits were connected to the ESR device; and then ESR measurement was conducted.

Figure 3:
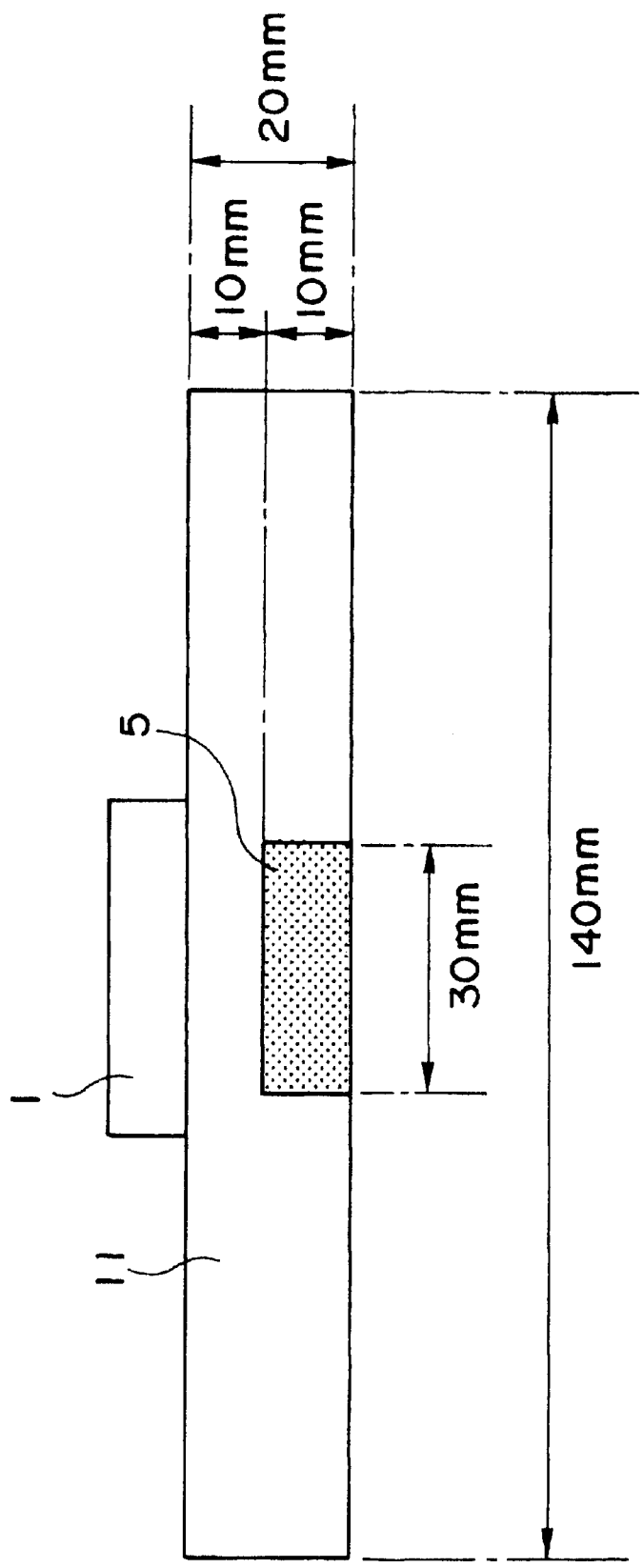
FIG. 3 is a drawing showing the positional relation between the resonator and the sample in ESR measurement conducted by the embodiment of the present invention.
Figure 4:
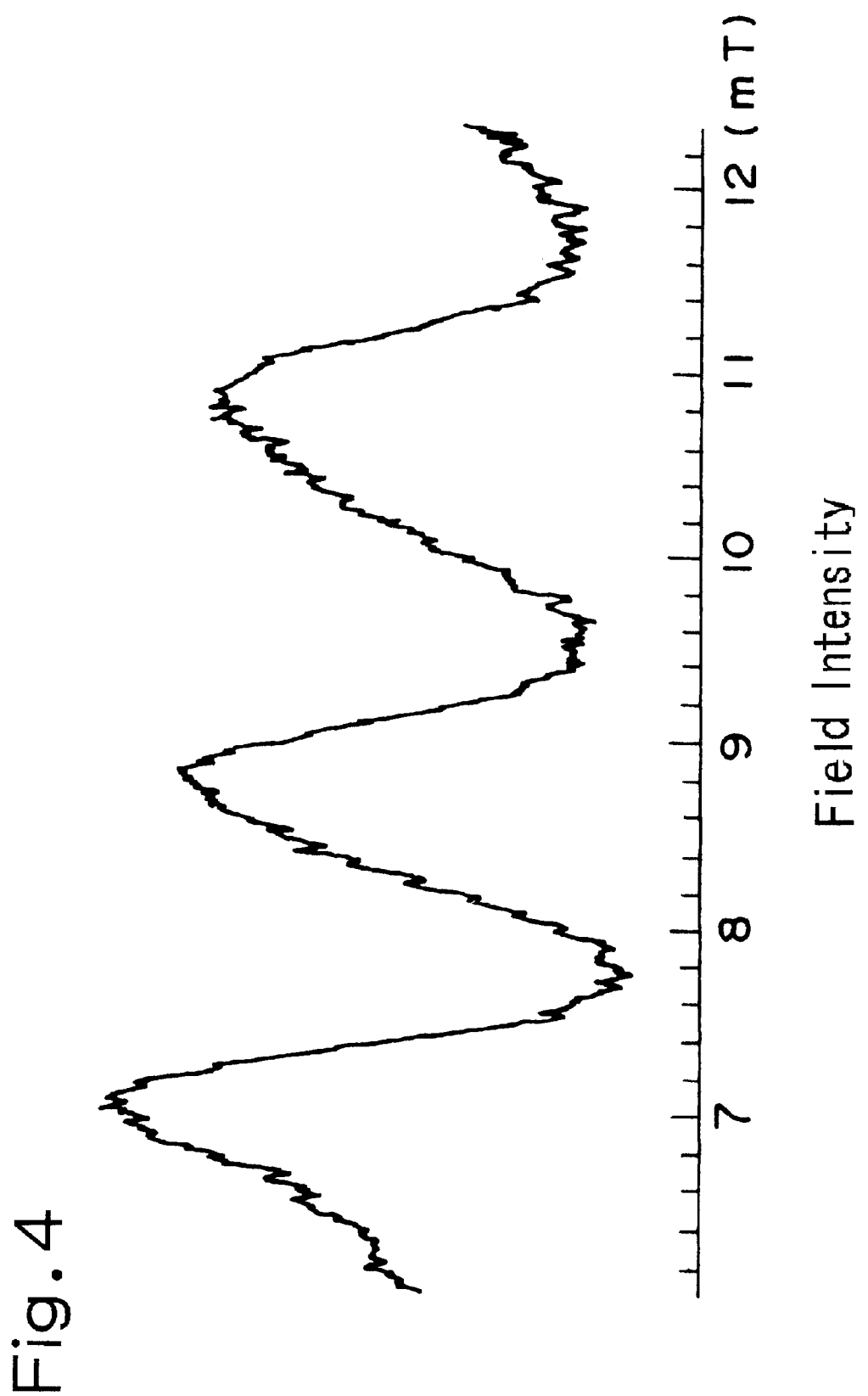
FIG. 4 is a drawing showing the results of measurement in the embodiment of the present invention in the form of signals obtained during measurement of a free radical sample positioned 10 mm below the lower end of the resonator.

A cylindrical agar sample measuring 30 mm in diameter and 10 mm in axial length was prepared with TEMPOL as the free radical. The TEMPOL concentration was 10 mM. A Teflon plate 11 measuring 20 mm in thickness, 140 mm in width, and 140 mm in length was prepared, a round hole 30 mm in diameter and 10 mm in depth was made in the center of the lower surface thereof, and the cylindrical free radical sample 5 was inserted therein. The ESR device was placed on Teflon plate 11 and positioned so that resonator 1 was above sample 5, and ESR measurement was conducted (FIG. 3). The upper end of free radical sample 5 was at a position 10 mm from the lower end of resonator 1. The measurement yielded ESR signals such as those shown in FIG. 4. The measurement conditions were as follows: radiowave frequency, 282 MHz; radiowave power, 40 mW; field modulation width 0.2 mT; field modulation frequency 100 kHz; scan rate 6.25 mT/s; time constant 0.001 s; and accumulation number, 32.

It was possible to observe the ESR signal of a free radical sample outside the device using the device of the present invention fabricated in the embodiment. Thus, it is clear that ESR measurement of free radicals present within a sample is possible from outside a large sample based on the device of the present invention.

Potential for of Industrial Application

The detection of free radicals present within a large sample, the determination of which was previously difficult, is possible by the method and device of the present invention. Accordingly, the present invention is extremely useful in examination relating to free radicals in various large samples, and in the establishment of methods of diagnosing, treating, and preventing disease relating to free radicals.

What is claimed is:

1. A method of measuring electron spin resonance (ESR) in an interior of a large sample located outside a resonator, the method comprising:
   positioning sample outside a resonator below a plane including the end of the resonator;
   generating an alternating magnetic field ($B_1$) from the end of the resonator to the exterior of the resonator;
   detecting the generated alternating magnetic field; and measuring the electron spin resonance of the interior of the large sample using the alternating magnetic field.

2. The method of claim 1, wherein low-frequency microwaves to radiowaves are employed as the ESR irradiation.

3. A method of measuring electron spin resonance (ESR) in an interior of a large sample, the method comprising:
   applying an alternating magnetic field $B_1$ with a resonator to the sample located outside the resonator;
   applying a static magnetic field ($B_0$) and a modulation field to the sample with at least one magnet and at least one field modulation coil located on the resonator side of a plane containing the end of the resonator;
   and measuring the ESR from the interior of the large sample, with the end of the resonator located above the sample, using the static magnetic field and the modulation field.

4. The method of claim 3, wherein low-frequency microwaves to radiowaves are employed as the ESR irradiation.

5. The method of claim 3, wherein the sample is an organ tissue liquid isolated or collected from an organism.

6. The method of claim 3, wherein the sample is an organism.

7. The method of claim 3, wherein the sample is a human body.

8. The method of claim 3, wherein the sample is mice, rats, guinea pigs, rabbits, cats, dogs, monkeys, chimpanzees or gorillas.

9. The method of claim 6, wherein the organism is measured without inflicting damage.

10. The method of claim 3, wherein the sample contains a radical agent.

11. The method of claim 10, wherein the radical agent is 4-hydroxy-2,2,6,-tetramethyl-piperidine-1-oxyl.

12. The method of claim 10, wherein the sample is an organism and the radical agent is delivered in the organism by a radical reagent feeder.

13. The method of claim 3, wherein $B_0$ and the modulation field applied to the sample are perpendicular to $B_1$ applied to the sample.

14. The method of claim 3, wherein the sample is placed in contact with the side of plane containing the end of the resonator.

15. The method of claim 3, wherein the sample is positioned in the space near the side of plane comprising the end of the resonator.

16. An electron spin resonance (ESR) device which measures electron spin resonance (ESR) in an interior of a large sample, comprising:
   a resonator applying an alternating magnetic field $B_1$, leaking from the end of the resonator to the sample located outside the resonator; and
   a magnet and a modulation field coil located on the resonator side of a plane containing the end of the resonator, the magnet applying a static magnetic field $B_0$ and said modulation field coil producing a modulation field, which are used in measuring the ESR of the interior of the large sample.

17. The ESR device of claim 16, wherein the resonator, a main magnet and a field modulation coil are integrated and are all positioned on a plane containing the end of the resonator next to the sample.

18. The ESR device of claim 16, wherein $B_0$ and the modulation field applied to the sample are perpendicular to $B_1$ applied to the sample.

19. The ESR device of claim 16, wherein low-frequency microwaves to radiowaves are employed as the ESR irradiation.

20. The ESR device of claim 16, wherein modulation frequency of the modulation field is near 100 kHz.

* * * * *